(12) United States Patent
Duwel et al.

(10) Patent No.: US 7,741,933 B2
(45) Date of Patent: Jun. 22, 2010

(54) ELECTROMAGNETIC COMPOSITE METAMATERIAL

(75) Inventors: Amy E. Duwel, Cambridge, MA (US); Jonathan S. Varsanik, Brookline, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 11/823,969

(22) Filed: Jun. 29, 2007

(65) Prior Publication Data

US 2008/0136563 A1 Jun. 12, 2008

Related U.S. Application Data (60) Provisional application No. 60/818,093, filed on Jun. 30, 2006.

(51) Int. Cl.
H03H 9/00 (2006.01)
(52) U.S. Cl. .................. 333/187; 333/186; 333/188; 333/189; 333/190
(58) Field of Classification Search .......... 333/186–201
See application file for complete search history.

(56) References Cited

U.S. PATENT DOCUMENTS

| | | | |
|---|---|---|---|
| 6,236,281 B1 * | 5/2001 | Nguyen et al. ............. 331/154 |
| 6,583,688 B2 * | 6/2003 | Klee et al. .................. 333/188 |
| 6,661,392 B2 * | 12/2003 | Isaacs et al. ............ 343/911 R |
| 6,713,938 B2 * | 3/2004 | Nguyen ...................... 310/309 |
| 6,859,114 B2 * | 2/2005 | Eleftheriades et al. ...... 333/156 |
| 6,933,812 B2 * | 8/2005 | Sarabandi et al. ........... 333/219 |
| 7,009,565 B2 | 3/2006 | Pidwerbetsky et al. |
| 7,015,865 B2 * | 3/2006 | Isaacs et al. ................ 343/757 |
| 7,057,476 B2 * | 6/2006 | Hwu .......................... 333/187 |
| 7,068,234 B2 * | 6/2006 | Sievenpiper ................ 343/745 |
| 7,405,866 B2 * | 7/2008 | Kuekes et al. .............. 359/321 |
| 7,446,712 B2 * | 11/2008 | Itoh et al. ............. 343/700 MS |
| 7,466,407 B2 * | 12/2008 | Spillane et al. ............. 356/301 |
| 7,495,532 B2 * | 2/2009 | McKinzie, III ............. 333/219 |
| 7,525,711 B1 * | 4/2009 | Rule et al. .................. 359/244 |
| 7,532,397 B2 * | 5/2009 | Tanaka et al. ............... 359/487 |
| 7,538,946 B2 * | 5/2009 | Smith et al. ................ 359/569 |
| 7,545,242 B2 * | 6/2009 | Beausoliel et al. .......... 333/239 |
| 7,592,957 B2 * | 9/2009 | Achour et al. ........ 343/700 MS |
| 2004/0066251 A1 * | 4/2004 | Eleftheriades et al. ...... 333/117 |
| 2005/0146402 A1 * | 7/2005 | Sarabandi et al. ........... 333/219 |
| 2005/0200540 A1 * | 9/2005 | Isaacs et al. ................ 343/754 |
| 2005/0212705 A1 * | 9/2005 | Legay et al. .......... 343/700 MS |
| 2007/0003450 A1 * | 1/2007 | Burdett et al. .............. 422/108 |
| 2007/0014006 A1 * | 1/2007 | Tanaka et al. ............... 359/487 |
| 2007/0285316 A1 * | 12/2007 | Saily et al. ............ 343/700 MS |
| 2009/0033586 A1 * | 2/2009 | Sanada .................... 343/911 R |

OTHER PUBLICATIONS

Smith et al. "Composite Medium with Simultaneously Negative Permeability and Permittivity" Physical Review Letters, vol. 84, No. 18, Published May 1, 2000. The American Physical Society, Copyright 2000.*

(Continued)

*Primary Examiner*—James H. Cho
*Assistant Examiner*—Matthew C Tabler
(74) *Attorney, Agent, or Firm*—Iandiorio Teska & Coleman (57) ABSTRACT

An electromagnetic composite metamaterial including an electromagnetic medium and a plurality of spaced electromechanical resonators disposed in or on the electromagnetic medium configured to control electromagnetic wave propagation properties in the electromagnetic composite metamaterial.

33 Claims, 7 Drawing Sheets

OTHER PUBLICATIONS

Ono et al., *Nanomechanics of Ultrathin Silicon Beams and Carbon Nanotubes*, 2003 IEEE, pp. 33-36.

Husain et al., *Nanowire-Based Very-High-Frequency Electromechanical Resonator*, Appl. Phys. Lett., vol. 83, No. 6, Aug. 11, 2003, pp. 1240-1242.

Candler et al., *Reduction in Thermoelastic Dissipation in Micromechanical Resonators by Disruption of Heat Transport*, Solid State Sensor, Actuator and Microsystems Workshop, 2004, Technical Digest, IEEE; Hilton Head, SC, USA Jun. 6-10, 2004.

S. Evoy et al., *Temperature-Dependent Internal Friction in Silicon Nanoelectromechanical Systems*, Appl. Phys. Lett., Oct. 9, 2000, vol. 77, No. 15, pp. 2397-2399.

Clark et al., *High-Q UHF Micromechanical Radial-Contour Mode Disk Resonators*, 2005, Journal of Microelectromechanical Systems, vol. 14, No. 6, Dec. 2005, pp. 1298-1310.

Moser et al., *Terahertz Response of a Microfabricated Rod-Split-Ring-Resonator Electromagnetic Metamaterial*, Feb. 18, 2005, Physical Review Letters, pp. 063901-1-063901-4.

Smith et al., *Composite Medium With Simultaneously Negative Permeability and Permittivity*, Physical Review Letters, May 1, 2000, vol. 84, No. 18, pp. 4184-4187.

Baccarelli et al., *Effects of Leaky-Wave Propagation in Metamaterial Grounded Slabs Excited by a Dipole Source*, Jan. 2005, IEEE Transactions on Microwave Theory and Techniques, vol. 53, No. 1, pp. 32-44.

Caloz et al., *Full-Wave Verification of the Fundamental Properties of Left-Handed Materials in Waveguide Configurations*, Dec. 1, 2001, American Institute of Physics, Journal of Applied Physics, vol. 90, No. 11, pp. 5483-5486.

Lai et al., *Composite Right/Left-Handed Transmission Line Metamaterials*, Sep. 2004, IEEE Microwave Magazine, pp. 34-50.

Samir F. Mahmoud, *A New Miniaturized Annular Ring Patch Resonator Partially Loaded by a Metamaterial Ring With Negative Permeability and Permittivity*, 2004, IEEE Antennas and Wireless Propagation Letters, vol. 3, pp. 19-22.

Ozbay et al., *Transmission and Reflection Properties of Composite Double Negative Metamaterials in Free Space*, Oct. 2003, IEEE Transactions on Antennas and Propagation, vol. 51, No. 10, Oct. 2003, pp. 2592-2595.

Barker et al., *Distributed MEMS True-Time Delay Phase Shifters and Wide-Band Switches*, Nov. 1998, IEEE Transactions on Microwave Theory and Techniques, vol. 46, No. 11, Nov. 1998, pp. 1881-1890.

Lee et al., *Low-Loss Analog and Digital Reflection-Type MEMS Phase Shifters With 1:3 Bandwidth*, Jan. 2004, IEEE Transactions on Microwave Theory and Techniques, vol. 52, No. 1, Jan. 2004, pp. 211-219.

Wiltshire et al., *Experimental and Theoretical Study of Magneto-Inductive Waves Supported by One-Dimensional Arrays of "Swiss Rolls"*, Apr. 15, 2004, Journal of Applied Physics, vol. 95, No. 8, Apr. 15, 2004, pp. 4488-4493.

Varsanik, J., Design and Analysis of MEMS-Based Metamaterials, 2006 Masters Thesis, pp. 1-107.

* cited by examiner

ELECTROMAGNETIC COMPOSITE METAMATERIAL

RELATED APPLICATIONS

This application claims benefit of and priority to Provisional Application, U.S. Provisional Patent Application No. 60/818,093, filed Jun. 30, 2006 incorporated by reference herein.

FIELD OF THE INVENTION

This invention relates generally to metamaterials and more particularly to an electromagnetic composite metamaterial for controlling electromagnetic wave propagation properties in the metamaterial.

BACKGROUND OF THE INVENTION

Metamaterials are artificial composites that achieve material performance beyond the limitation of uniform materials and exhibit properties not found in naturally-formed substances. Such artificially structured materials are typically constructed by patterning or arranging a material or materials to expand the range of electromagnetic properties of the material.

When an electromagnetic wave enters a material, such as a metamaterial, the electric and magnetic fields of the wave interact with electrons and other charges of the atoms and molecules of the material. These interactions alter the motion of the wave changing the electromagnetic wave propagation properties in the material, e.g., velocity, wavelength, direction, dispersion, impedance, index of refraction, and the like. The velocity and wavelength of the electromagnetic wave in a material is controlled by two parameters: electric permittivity ($\epsilon$) and magnetic permeability ($\mu$). The velocity of an electromagnetic wave in the material is governed by:

$$c = \frac{1}{\sqrt{\mu\varepsilon}} \quad (1)$$

and the wavelength of an electromagnetic wave in the material is governed by:

$$\lambda = \frac{c}{f} = \frac{1}{f\sqrt{\mu\varepsilon}} \quad (2)$$

where f is the frequency of the electromagnetic wave. As shown by equations (1) and (2), increasing the value of $\mu$ and/or $\epsilon$ in a metamaterial is one way to control electromagnetic wave propagation properties in the metamaterial, such as reducing the velocity and wavelength.

The dimensions of an antenna are usually determined by the frequency at which the antenna is designed to function. An ideal antenna is some multiple (or half multiple) of the electromagnetic wavelength such that the antenna can support a standing wave. Antennas usually do not satisfy this constraint because designers either require the antenna to be smaller than a particular wavelength, or the antenna is simply not allotted the required volume in a particular design. When an antenna is not at its ideal dimensions, reflections from the edges of the antenna interfere with the standing wave and the antenna loses efficiency. An antenna, or guided wave structure, is often used to capture information encoded on an electromagnetic wave. However, if the antenna is smaller than an incoming electromagnetic wavelength, the information is captured inefficiently and considerable power is lost. One way to overcome the aforementioned problems is to use a metamaterial and reduce the wavelength of the electromagnetic wave in the metamaterial of the antenna by increasing the value of $\mu$ and/or $\epsilon$ for the metamaterial of the antenna. Increasing $\mu$ and/or $\epsilon$ in a metamaterial allows for making ultra-miniature antennas, as well as also other smaller devices, such as phase shifters, beam steering devices, and the like.

Every material has a different value for $\mu$ and $\epsilon$. One approach used in conventional metamaterials to reduce the wavelength or velocity in a material is to choose materials that naturally have high values for $\epsilon$ and $\mu$. But, this often results in an impedance mismatch at the edges of the material. Impedance can be thought of as the resistance of a material to the propagation of electromagnetic waves. Impedance is described by the ratio of the magnetic component of an electromagnetic wave to its electrical component. In a non-conducting electromagnetic medium, this relationship is described by:

$$Z = \frac{\mu}{\varepsilon} \quad (3)$$

At the interface between two materials, it is the difference in impedances that leads to reflections and energy loss. When electromagnetic waves propagate through a material, some of the energy of electromagnetic waves turns to thermal energy. Choosing a material with a high value for $\epsilon$ is one way to reduce thermal losses. Ideally, one would decrease the wavelength in the metamaterial by choosing a high value for $\mu$ and choosing a high value for $\epsilon$ to reduce thermal losses while keeping the ratio of $\mu/\epsilon$ the same to reduce impedance mismatch and reflections. However, in practice, this is not currently possible with conventional materials.

If the impedances of the two materials are matched, the energy exchange across the interface will be perfectly efficient. Therefore, one of the benefits of engineered materials and metamaterials is the ability to vary the permittivity and permeability of the material to achieve the desired wavelength, while keeping optimal impedance.

Any variation in a material on a length scale smaller than the wavelength of an incident electromagnetic wave looks as a continuous material to that electromagnetic wave. One way to engineer metamaterials is to include composite structures inside the material and keep the spacing between the structures small compared to the wavelength of the electromagnetic wavelength. Thus, composite metamaterials can be designed by combining materials where $\epsilon$ is optimized in one material and $\mu$ is optimized in another material such that the scales of the two materials are smaller than the wavelength of the electromagnetic wave. An electromagnetic wave therefore interacts with the composite as if it were a bulk material with the desired values of $\mu$ and $\epsilon$.

One conventional metamaterial uses small circuits spaced smaller than the wavelength of an incoming electromagnetic wave. See "Composite Right/Left-Handed Transmission Line Metamaterials", IEEE Microwave Magazine, 2004, ITOH, incorporated herein by reference. As disclosed therein, a metamaterial is comprised of periodic arrays of resonating elements, e.g., capacitor-inductor elements, arranged to couple effectively into an antenna or guided wave structure that modifies an electromagnetic wave.

However, the disadvantages of this metamaterial include electrical losses in the structure, the challenge of attaining the high inductance required to operate at the desired frequencies, and the large size of individual elements. These disadvantages limit the range of resonant frequencies that can be achieved and the minimum size the structure can achieve.

Another way to control electromagnetic wave propagation properties in a material is to use electromechanical resonators to convert the electrical energy of electromagnetic wave to mechanical energy, e.g., vibrations, and store the mechanical energy therein. If the electromechanical resonators were spaced in a medium such that the spacing between the electromechanical resonators was small compared to the wavelength of the electromagnetic wave, an innovative new electromagnetic composite metamaterial could be achieved.

BRIEF SUMMARY OF THE INVENTION

It is therefore an object of this invention to provide a new electromagnetic composite metamaterial.

It is a further object of this invention to provide such an electromagnetic composite metamaterial that controls electromagnetic wave propagation properties using electromechanical resonators.

It is a further object of this invention to provide such an electromagnetic composite metamaterial which reduces the size of a device made of the metamaterial.

It is a further object of this invention to provide such an electromagnetic composite metamaterial which provides smaller unit elements.

It is a further object of this invention to provide such an electromagnetic composite metamaterial which increases the range of resonant frequencies that can be achieved with a device made of the metamaterial.

It is a further object of this invention to provide such an electromagnetic composite metamaterial which eliminates the problems associated with trying to match the electric permittivity and magnetic permeability.

It is a further object of this invention to provide such an electromagnetic composite metamaterial which virtually eliminates impedance mismatch and reflections.

The subject invention results from the realization that an electromagnetic composite metamaterial is effected, in one embodiment, with an electromagnetic medium and the plurality of spaced electromechanical resonators in or on the electromagnetic medium that control electromagnetic wave propagation properties. The small electromechanical resonators convert and store the electrical energy of the electromagnetic wave as mechanical energy, or vibrations, which provides for controlling the electromagnetic wave propagation properties in the metamaterial, e.g., velocity, wavelength, direction, dispersion, impedance, index of refraction, and the like. This reduces the size of a device made of the material, increases the range of resonant frequencies that can be achieved, virtually eliminates impedance mismatch and reflections, and eliminates the problems associated with manufacturing a metamaterial by choosing different values for μ and ε or using closely spaced arrays of capacitive-inductor unit cells.

The subject invention, however, in other embodiments, need not achieve all these objectives and the claims hereof should not be limited to structures or methods capable of achieving these objectives.

This invention features an electromagnetic composite metamaterial including an electromagnetic medium and a plurality of spaced electromechanical resonators disposed in or on the electromagnetic medium configured to control electromagnetic wave propagation properties in the electromagnetic composite metamaterial.

In one embodiment, the plurality of spaced electromechanical resonators in or on the electromagnetic medium control electromagnetic wave propagation properties that may be chosen from the group consisting of velocity, index of refraction, wavelength, direction, dispersion, and impedance. The electromagnetic medium may include a medium chosen from the group consisting of a solid material, a liquid, and a gas. One or more of the plurality of spaced electromechanical resonator may include at least one MEMS piezoelectric resonator. One or more of the plurality of spaced electromechanical resonators may include at least one MEMS frequency tunable electromechanical resonator. The operating frequency of the at least one MEMS frequency tunable electromagnetic resonators may be adjustable to change the electromagnetic wave propagation properties in metamaterial by applying at least one of electrostatic voltages, magnetic forces, thermal actuation, chemical actuation, or light induction. The at least one MEMS frequency tunable electromagnetic resonator may include at least one cantilever electromechanical resonator. The at least one MEMS frequency tunable electromechanical resonator may include at least one paddle electromechanical resonator. The at least one MEMS frequency tunable electromechanical resonators may include at least one tuning fork electromechanical resonator, or at least one disk electromechanical resonator. The at least one MEMS piezoelectric resonator may include a piezoelectric resonator chosen from the group consisting of: a surface acoustic wave piezoelectric resonator, a control mode piezoelectric resonator, a thickness mode piezoelectric resonator, a shear mode piezoelectric resonator, and a Lamé mode piezoelectric resonator. The plurality of spaced electromechanical resonators may be disposed in or on the electromagnetic medium in a lattice network arrangement. The plurality of spaced electromechanical resonators may be configured in one dimension in or on the electromagnetic medium. The plurality of spaced electromechanical resonators may be configured in two dimensions in or on the electromagnetic medium. The plurality of spaced electromechanical resonators may be configured in three dimensions in or on the electromagnetic medium. The plurality of spaced electromechanical resonators may be disposed in the electromagnetic medium. The plurality of spaced electromechanical resonators may be disposed on the electromagnetic medium. The plurality of spaced electromechanical resonators may be disposed at the interface between two electromagnetic media. The electromagnetic composite metamaterial may be configured as an antenna, a phase shifter, a delay element, a beam focusing device, a beam steering device, a frequency selective surface, an invisibility material, or a lens.

This invention also features an electromagnetic composite metamaterial including an electromagnetic medium and a plurality of spaced MEMS electromechanical resonators disposed in or on the electromagnetic medium configured to control electromagnetic wave propagation properties in the electromagnetic composite metamaterial.

This invention further features an electromagnetic composite metamaterial including an electromagnetic medium and a plurality of spaced electromechanical resonators having an electromagnetic wave traveling therein disposed in or on the electromagnetic medium configured to control propagation properties of the electromagnetic wave in the electromagnetic composite metamaterial.

This invention also features an electromagnetic composite metamaterial including an electromagnetic medium and a plurality of spaced MEMS piezoelectric electromechanical resonators having an electromagnetic wave traveling therein disposed in or on the electromagnetic medium configured to control propagation properties of the electromagnetic wave in the electromagnetic composite metamaterial.

This invention also features an electromagnetic composite metamaterial including an electromagnetic medium and a plurality of spaced MEMS frequency tunable electromechanical resonators having an electromagnetic wave traveling therein disposed in or on the electromagnetic medium configured to control propagation properties of the electromagnetic wave in the electromagnetic composite metamaterial.

This invention further features an electromagnetic composite metamaterial including an electromagnetic medium and a plurality of spaced MEMS cantilever electromechanical resonators having an electromagnetic wave traveling therein disposed in or on the electromagnetic medium configured to control propagation properties of the electromagnetic wave in the electromagnetic composite metamaterial.

This invention further features an electromagnetic composite metamaterial including an electromagnetic medium and a plurality of spaced MEMS paddle electromechanical resonators having an electromagnetic wave traveling therein disposed in or on the electromagnetic medium configured to control propagation properties of the electromagnetic wave in the electromagnetic composite metamaterial.

This invention also features an electromagnetic composite metamaterial including an electromagnetic medium and a plurality of spaced MEMS tuning fork electromechanical resonators having an electromagnetic wave traveling therein disposed in or on the electromagnetic medium configured to control propagation properties of the electromagnetic wave in the electromagnetic composite metamaterial.

This invention further features an electromagnetic composite metamaterial including an electromagnetic medium and a plurality of spaced MEMS disk electromechanical resonators having an electromagnetic wave traveling therein disposed in or on the electromagnetic medium configured to control propagation properties of the electromagnetic wave in the electromagnetic composite metamaterial.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

The subject invention, however, in other embodiments, need not achieve all these objectives and the claims hereof should not be limited to structures or methods capable of achieving these objectives.

Figures 1A, 1B:
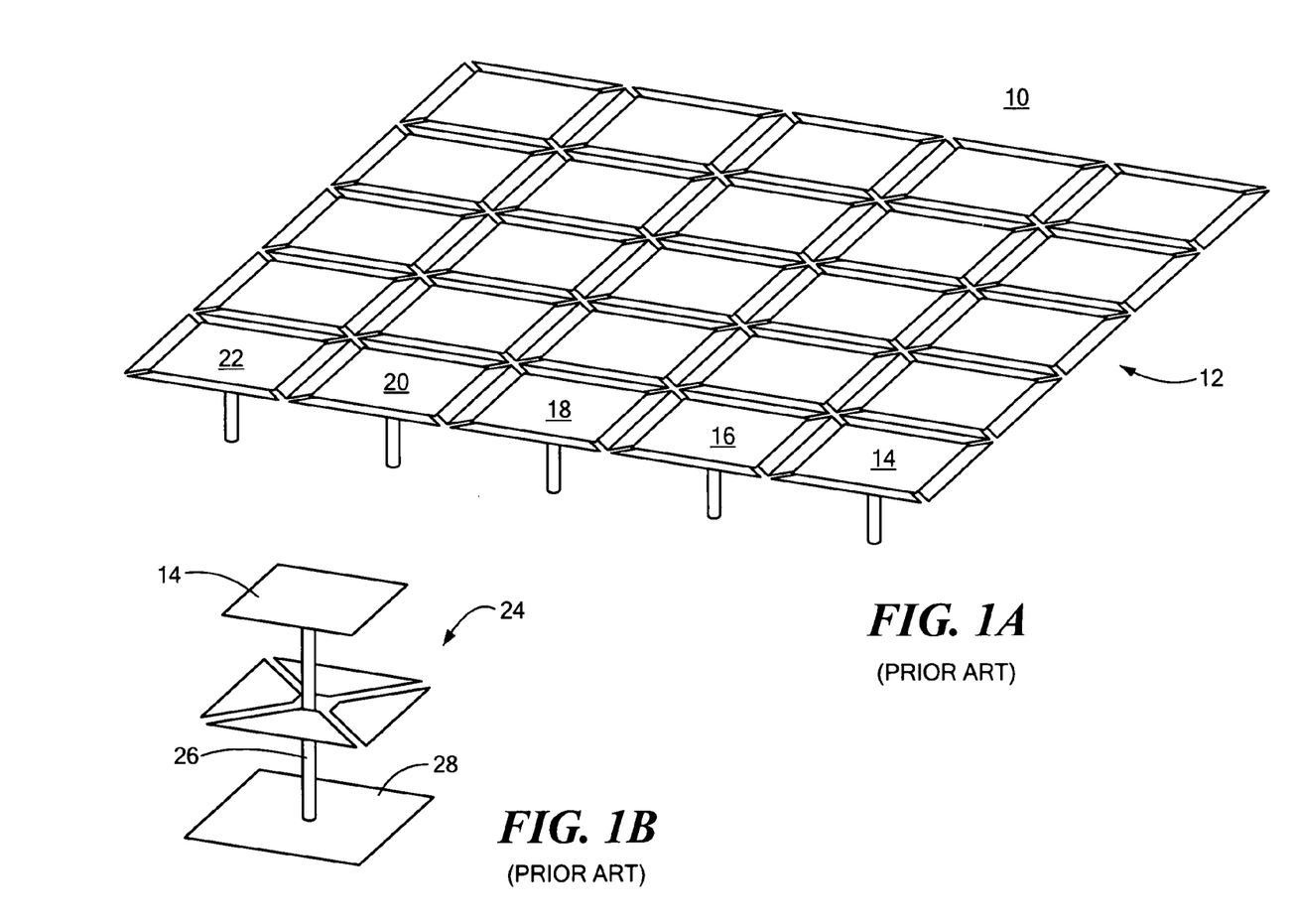
FIG. 1A is a schematic three-dimensional view of a conventional metamaterial comprised of periodic arrays of capacitor-inductor unit elements.
FIG. 1B is a schematic three-dimensional view showing in further detail an example of a capacitor-inductor unit element shown in FIG. 1A.

One conventional metamaterial 10, FIG. 1A, includes periodic array 12 of capacitive-inductive networks comprised of capacitive-inductive unit elements, e.g., capacitor-inductor unit elements 14, 16, 18, 20 and 22 that are collectively spaced smaller than the wavelength of an electromagnetic wave. Each of unit elements 14-22, e.g., element 14, FIG. 1B, includes capacitor 24 and inductor 26 connected to ground 28. As discussed in the Background section, capacitor-inductor unit elements 14-22 modify the electromagnetic propagation properties, e.g., the wavelength or velocity of an incoming electromagnetic wave so that metamaterial 10 forms a guided-wave structure or antenna. Metamaterial 10 achieves its behavior as a result of phase shifting through each of the individual elements 14-22, signal interference from elements 14-22, simple lump type element loading, and the like. The disadvantage of such a design is electrical losses in elements 14-22, the difficulty in attaining high inductances in the small area of each element 14-22, and the large size of individual elements 14-22. The relatively low inductance achieved through the design limits the range of resonant frequencies as well as the minimum size that can be achieved with a device made of metamaterial 10. The larger size of individual unit cells 14-22 resulting from inductance and the frequency requirements also limits the flexibility of the overall design, resulting in a large footprint and increased inductance and resistance.

Figure 2A:
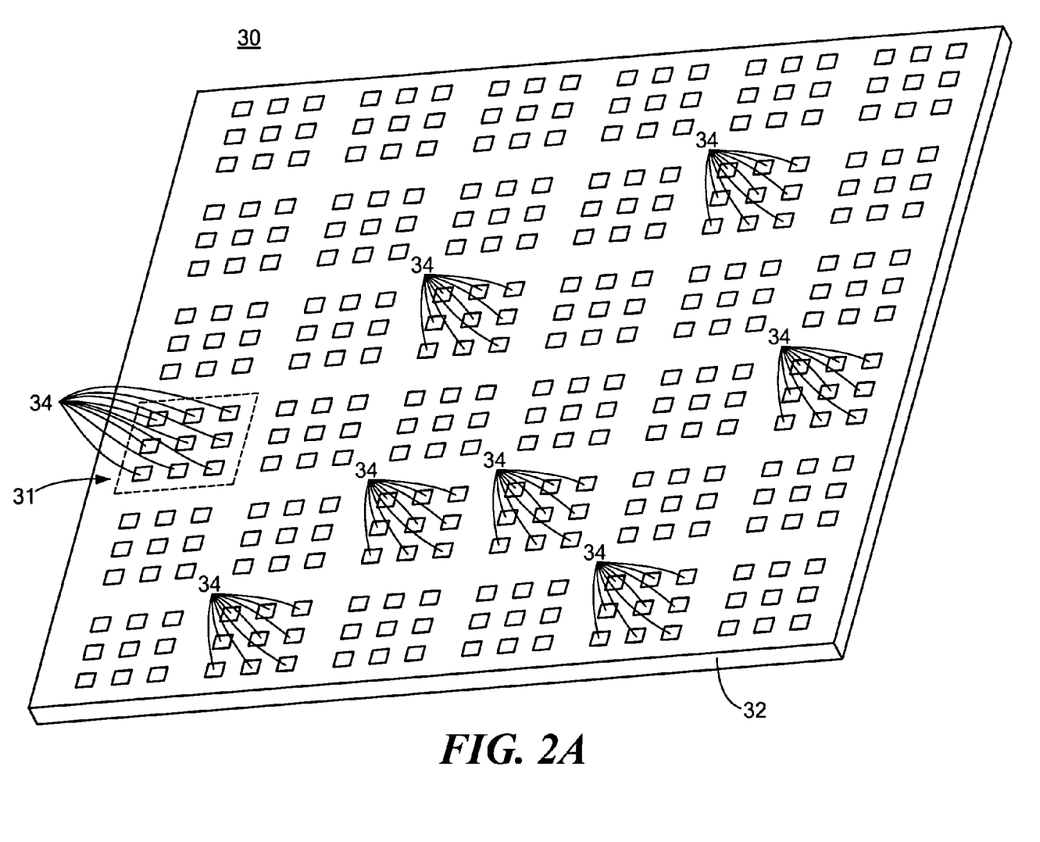
FIG. 2A is a schematic three-dimensional view of one embodiment of the electromagnetic composite metamaterial of this invention.

In contrast, electromagnetic composite metamaterial 30, FIG. 2A of this invention, in one embodiment, includes electromagnetic medium 32 and a plurality of spaced electromechanical resonators 34 (an exemplary number of which are indicated) in or on electromagnetic medium 32 that control the electromagnetic wave propagation properties in electromagnetic metamaterial 30. Electromagnetic medium 32 may be a solid material, a liquid, or gas. Each of the plurality of spaced electromechanical resonators 34 convert the electrical energy of an electromagnetic wave, e.g., electromagnetic wave 36, FIG. 2B, to mechanical energy and store the energy mechanically as a physical vibrations. Each of the plurality of spaced electromechanical resonators 34, FIG. 2A, are sized and closely spaced to each other so they are smaller than the wavelength of electromagnetic wave 36. In one exemplary design, the size of each of the plurality of electromechanical resonators 34 is between about 10 to 100 μm and the spacing between each of plurality of electromechanical resonators 34 is about 1 to 100 μm. In one example, the size of electromagnetic wave 36 is about 30 m to 30 mm is at frequencies between about 10 MHz to 106 Hz. However, depending on the specific design of metamaterial 30 and the frequency of operation, the size of each of the plurality of electromechanical resonators 34, the spacing between electromechanical resonators 34, and the number of electromechanical resonators 34 used can vary significantly, as known to those skilled in the art.

In operation, electromagnetic wave 36 sees each of the plurality of electromechanical resonators 34 and the spaces there between as a continuous material. Once electromagnetic wave 36 has been converted and stored as mechanical energy, the plurality of spaced electromechanical resonators 34 are designed to control electromagnetic wave propagation properties in electromagnetic composite metamaterial 30. In practice, in order to effectively control the electromagnetic wave propagation properties in composite metamaterial 30, composite metamaterial 30 has a size which is at least on the order of the size of electromagnetic wave 36 FIG. 2B.

Figure 2B:
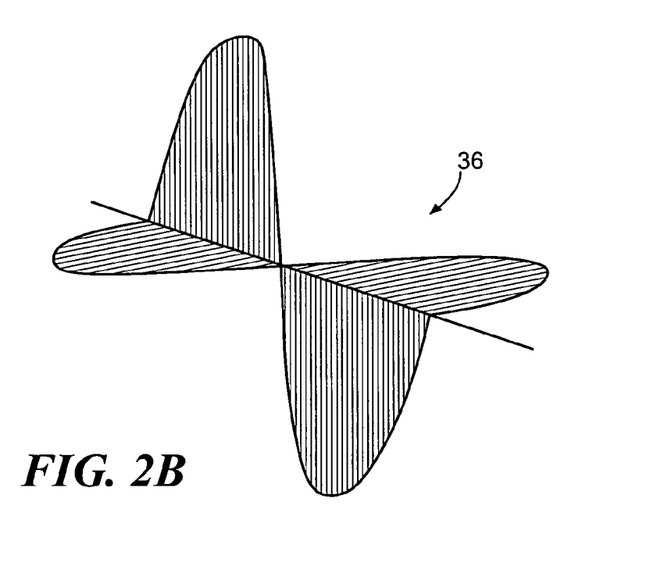
FIG. 2B is a schematic three-dimensional view of an example of an electromagnetic wave that interacts with the electromagnetic composite metamaterial shown in FIG. 2A.
Figure 2C:
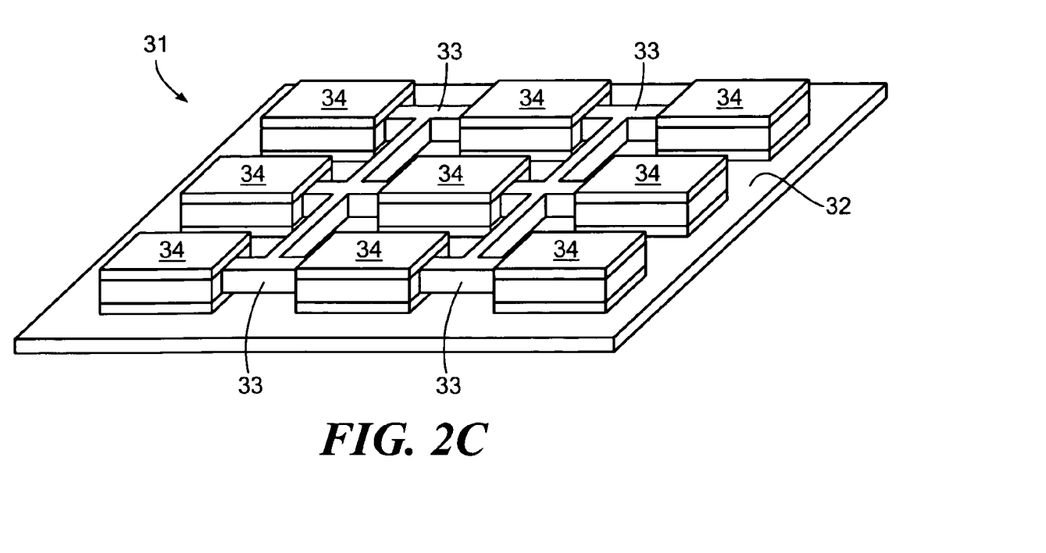
FIG. 2C is a three-dimensional view of an exemplary piece of the electromagnetic composite metamaterial shown in FIG. 2A.

FIG. 2C, where like parts have been given like numbers, shows an example of piece 31, FIG. 2A metamaterial 30 with a plurality of electromechanical resonators 34, FIG. 2C connected to each other by connection 33. Connection 33 transfers energy between the electromechanical resonators 34. Connection 33 may be a mechanical connection, e.g., a tether, or an electrical or electromagnetic connection, e.g., a wire or transmission line. In this example, the plurality of electromechanical resonators 34 are MEMs resonators, e.g., a piezoelectric resonator (discussed below).

Preferably, the electromagnetic wave propagation properties controlled by metamaterial 30 include velocity, index of refraction, wavelength, dispersion (spreading), phase shift, and impedance. Because the wavelength and/or velocity of electromagnetic wave 36 in metamaterial 30 can be reduced when it is converted to mechanical energy, the problems associated with the wavelength of an electromagnetic wave being too large for a device made of metamaterial 30 are eliminated. This provides the ability to manufacture smaller devices, e.g., ultra-miniature antennas, phase shifts, delay elements, beam focusing devices, beam steering devices, phase shifters, a frequency selective surface, an invisibility material, a lens, and the like, using metamaterial 30. The small size of each of the plurality of spaced electromechanical resonators 34 also provides for making smaller similar type devices using metamaterial 30. The electromagnetic wave propagation properties in metamaterial 30 can be controlled by changing the parameters of one or more or all of the plurality of spaced electromechanical resonators 34, such as the size, shape, geometry and other various parameters associated with one or more of the plurality of spaced electromechanical resonators 34. Thus, metamaterial 30 provides an innovative and effective way to control the electromagnetic wave propagation properties of a wave traveling through metamaterial 30.

In one embodiment, one or more, or all, of the plurality of spaced electromechanical resonators 34 may include a microelectro-mechanical system (MEMS) resonator, e.g., MEMS piezoelectric resonator 40, FIG. 3, MEMS cantilever electromechanical resonator 50, FIG. 4, MEMS paddle resonator 70, FIG. 5, MEMS tuning fork resonator 100, FIG. 6, or MEMS disk resonator 110, FIG. 7 (discussed in further detail below). As defined herein, MEMS resonators may include nanoelectromechanical systems (NEMS). MEMS resonators have small size, low loss, and adjustable resonant frequencies. Typical measured resonant frequencies of a MEMS resonator in accordance with this invention are in the range of about 10 MHz to 10 GHz. MEMS resonators are also very small, e.g., less than about 100 μm. Thus, when one or more, or all, of the plurality of spaced electromechanical resonator 34 are MEMS electromechanical resonators, they can be combined in areas smaller than the wavelength of electromagnetic wave 36 and provide the ability for complex behavior in a very small device.

Because metamaterial 30 does not rely on capacitor-inductor unit elements, the problems associated therewith are eliminated and the overall size of an antenna or guided-wave structure, or any device made of metamaterial 30, can be significantly reduced. Moreover, because the plurality of spaced electromechanical resonators 34 may include MEMS electromechanical resonators, a higher range of resonant frequencies can be achieved. Additionally, because the plurality of spaced electromechanical resonators 34 convert the electric energy of electromagnetic wave 36 to mechanical energy and are spaced so that electromagnetic wave 36 sees them as a continuous material. This material can be designed to achieve desired values of μ and ε. the problems associated with mismatched μ and ε are eliminated. Thus, impedance mismatching and reflection can be virtually eliminated or significantly reduced.

Figure 3:
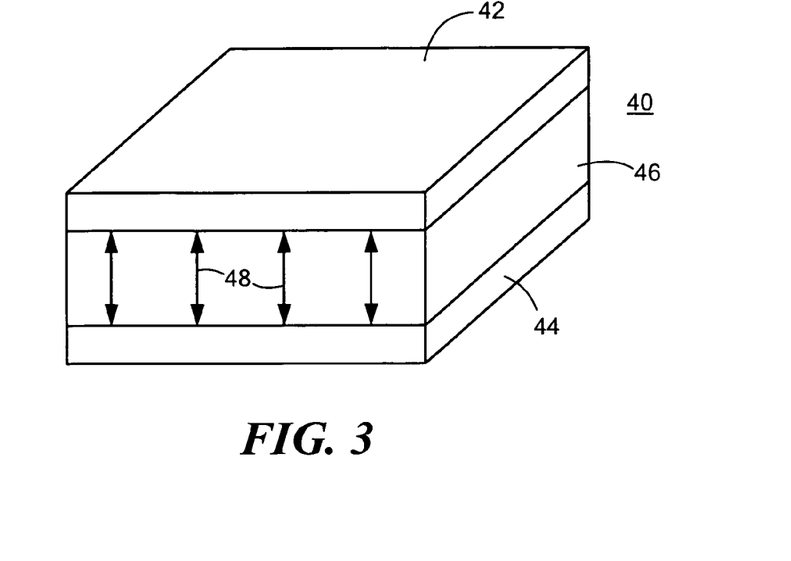
FIG. 3 is a schematic three-dimensional view of one example of a piezoelectric resonator that may be employed with the plurality of spaced electromechanical resonators shown in FIG. 2A.

As shown in FIG. 2C, each of the plurality of spaced electromechanical resonators 34 is a MEMS piezoelectric resonator, such as piezoelectric resonator 40, FIG. 3. Piezoelectric resonator 40 has coplanar design and includes electrodes 42 and 44 with piezoelectric substrate 46, e.g., aluminum nitride, or similar type material, sandwiched there between. In one example, electrodes 42 and 44 are made of 300 Å of chromium disposed over 150 Å of platinum and are 4 μm wide by 41 μm long. In this example, piezoelectric resonator 40 is disposed on a solid material, e.g., a wafer of silicon that functions as electromagnetic medium 32, FIG. 2A, and is attached to the solid material by anchors. In other designs, piezoelectric resonator 40 may be disposed inside the solid material.

In operation, electric fields applied to electrodes 42 and 44 by electromagnetic wave 36, FIG. 2B, create oscillating currents that stretch and compress the piezoelectric material 46, FIG. 3, as shown by arrows 48. This action converts the electric energy of electromagnetic wave 36 to mechanical vibrations. In one embodiment, piezoelectric resonator 40 may be a surface acoustic wave piezoelectric resonator, a contour mode piezoelectric resonator, a thickness mode piezoelectric resonator, a shear mode piezoelectric resonator, or a Lamé mode piezoelectric resonator. As known by those skilled in the art, variations in the size, geometry and spacing of electrodes 42 and 44 and the material chosen for piezoelectric substrate 46 provides numerous ways piezoelectric resonator 40 can convert electrical energy of electromagnetic wave 36 to mechanical energy to control the electromagnetic wave propagation properties in metamaterial 30, FIG. 2A, e.g., velocity, index of refraction, wavelength, dispersion, impedance, and the like.

Figure 4:
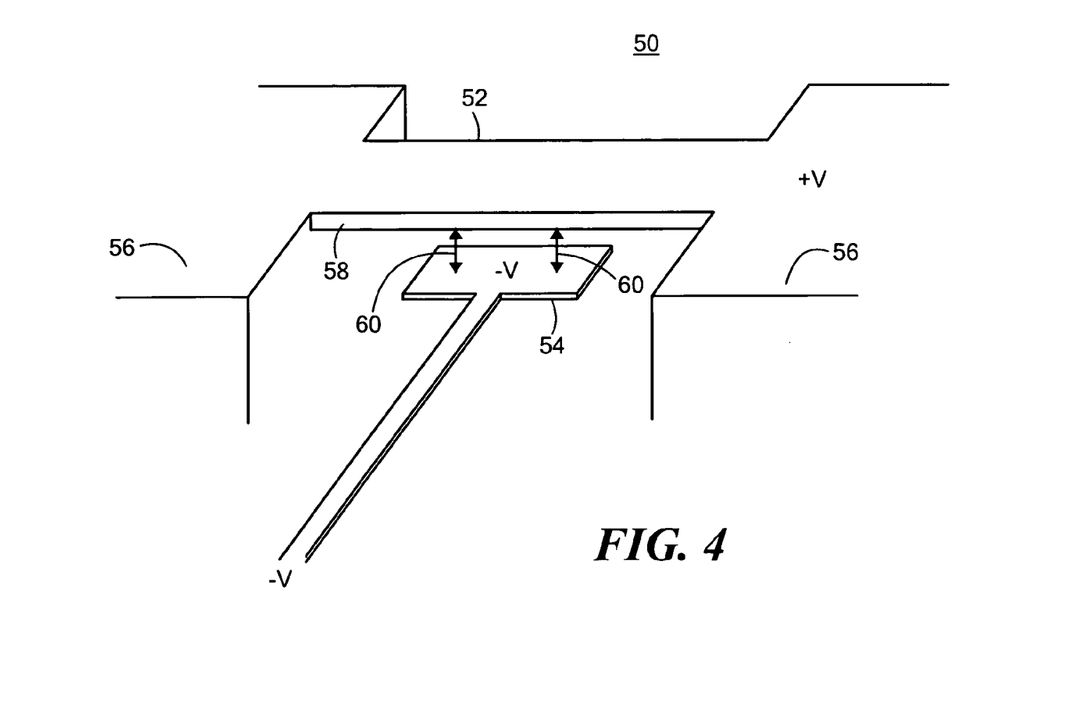
FIG. 4 is a schematic three-dimensional view of an example of a frequency tunable vibrating mass with single-end support electromagnetic resonator that may be employed with the plurality of spaced electromechanical resonators shown in FIG. 2A.

One or more, or all, of the plurality of electromechanical resonators 34, FIG. 2A, may include a MEMS frequency tunable electromechanical resonator, such as electromechanical cantilever resonator 50, FIG. 4. Electromechanical cantilever resonator 50 includes electrode 52 suspended over electrode 54. Electrode 52, typically rectangular in shape, is connected to base 56 by supporting member 58. Electrode 54 is coupled to base 56 and is designed to remain stationary during operation. In this example, electromechanical cantilever resonator 50 is disposed on a solid material, e.g., a wafer of silicon that functions as electromagnetic medium 32, FIG. 2A, and is attached to the solid material by supporting members. In other designs, electromechanical resonator 50 may be disposed inside the solid material 32 (not shown).

In operation, electrode 52 vibrates up and down in the direction indicated by arrows 60 in response to electromagnetic wave 36, FIG. 2B. This action converts the electrical energy in electromagnetic wave 36 to mechanical energy to control the electromagnetic wave propagation properties in metamaterial 30, FIG. 2B. In one design, the operating frequency of electromechanical cantilever resonator 50 is adjustable to change the electromagnetic wave propagation properties in metamaterial 30 by applying at least one of electrostatic voltages, magnetic forces, thermal actuation, chemical actuation and light-induction, as known by those skilled in the art. See, e.g., "*Nanomechanics of Ultrathin Silicon Beams and Carbon Nanotube*", Ono, T. et al., Micro Electro Mechanical Systems, 2003, IEEE The Sixteenth Annual International Conference, pp. 33 to 36 (January 2003), and "*Nanowire-Based Very-High-Frequency Electromechanical Resonator*", Husain, A. et al., Applied Physics Letters 83, 1240 (2003), both incorporated by reference herein.

Figure 5:
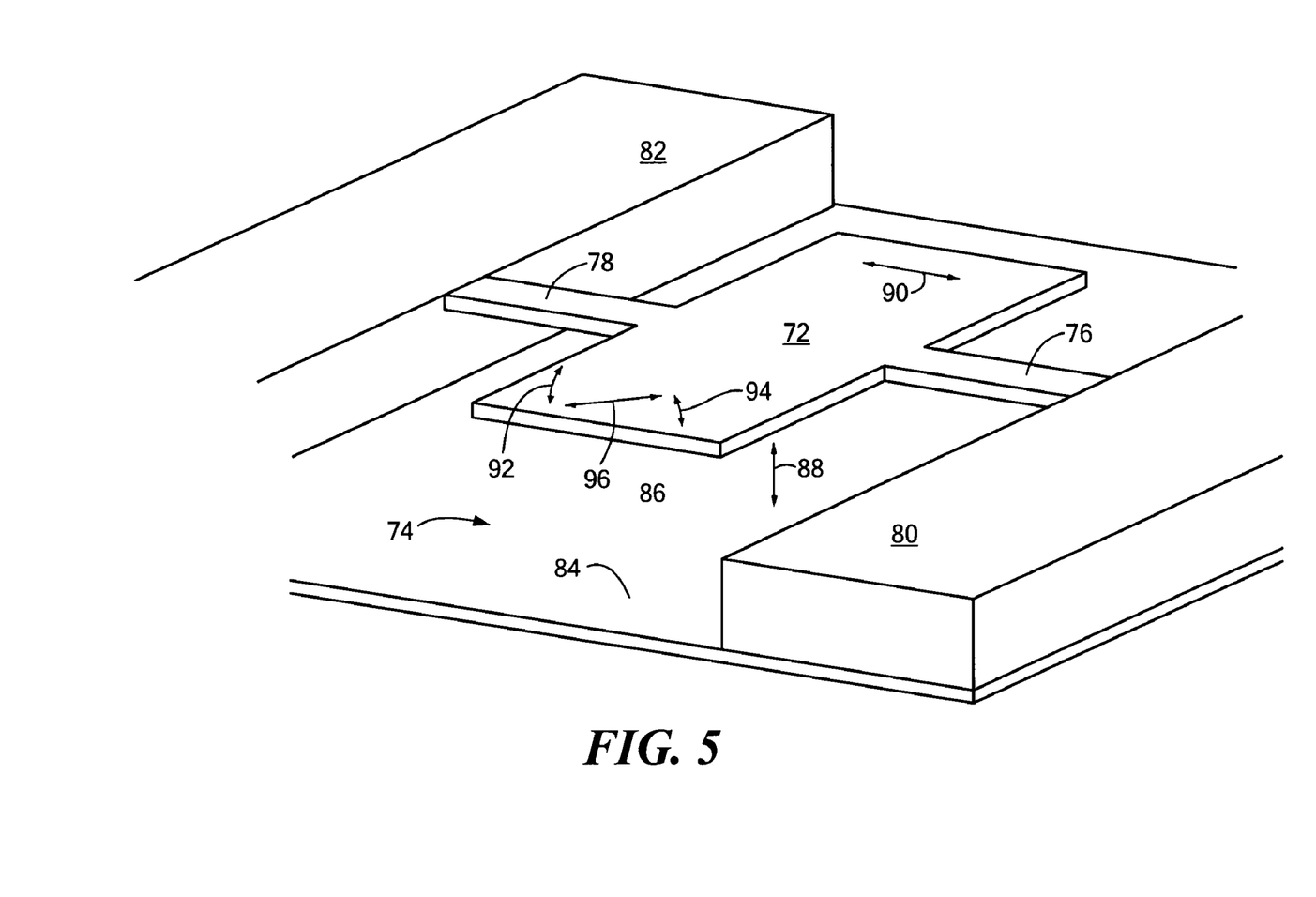
FIG. 5 is a schematic three-dimensional view of an example of a frequency tunable paddle resonator that may be employed with the plurality of electromechanical resonators shown in FIG. 2A.

In one embodiment, one or more, or all, of the plurality of electromechanical resonators 34, FIG. 2A, may include at least one MEMS frequency tunable electromechanical resonator, such as electromechanical paddle resonator 70, FIG. 5 that can be tuned to adjust the electromagnetic wave propagation properties in metamaterial 30, FIG. 2A. Paddle resonator 70, FIG. 5, includes paddle 72 suspended over trench 74 by supporting rods 76 and 78 that approximately bisect opposite sides of paddle 72. Rods 76 and 78 are connected to solid material 80 and 82, respectively. Paddle resonator 70 is disposed on a solid material, e.g., a wafer of silicon which functions as electromagnetic medium 32, FIG. 2A, and is attached to the solid material by anchors. In other designs, paddle resonator 70 may be disposed inside the solid material (not shown).

In operation, the electric fields of electromagnetic wave 36 cause wave paddle 72, FIG. 5, to vibrate to convert and store the electric energy of wave 36 to mechanical energy which controls the electromagnetic wave propagation properties of metamaterial. There are several modes of vibration for paddle 72, including shifting up and down, indicted by arrow 88, to the left and right, indicated by arrow 90 or in a "seesaw" fashion, indicated by arrows 92, 94 and 96. The "seesaw" motion is also known as the torsional mode and occurs at the highest frequencies, as known by those skilled in the art. In one design, frequency tuning is achieved by applying a potential from conducting pad 84 in trench 74 underneath side 86 of paddle 72. In one design, the operating frequency of paddle resonator 70 is adjustable to change the electromagnetic wave propagation properties in metamaterial 30 by applying at least one of electrostatic voltages, magnetic forces, thermal actuation, chemical actuation and light-induction, as known by those skilled in the art. See, e.g., "*Temperature-Dependent Internal Friction in Silicon Nanoelectromechanical Systems*," Envoy, A. et al. Applied Physics Letters, Vol. 77 (15), pp. 2397 to 2399 (2000), incorporated by reference herein.

Figure 6:
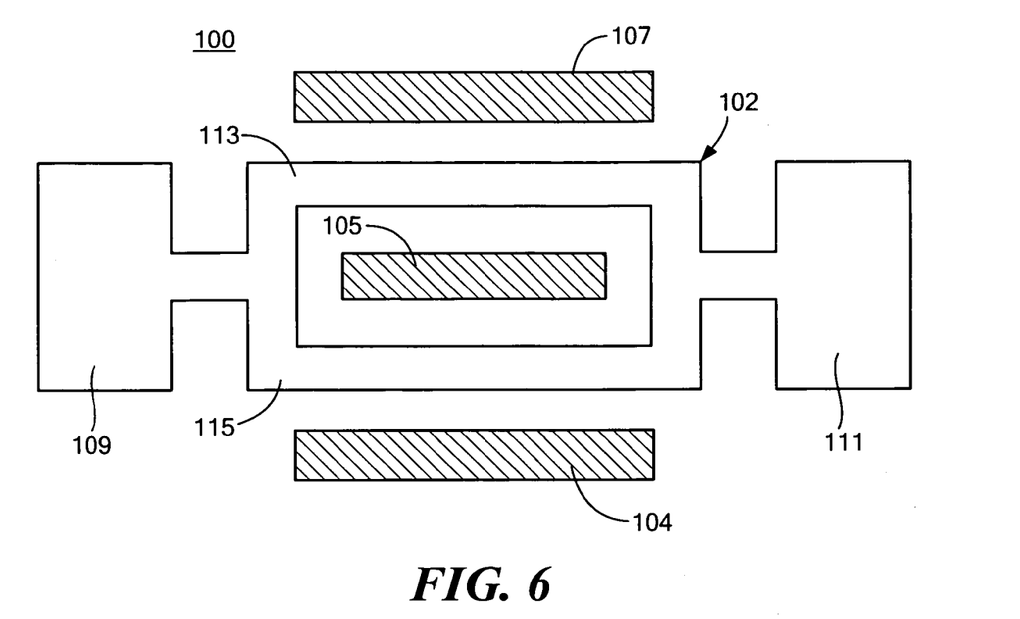
FIG. 6 is a schematic top view of an example of a frequency tunable tuning fork electromechanical resonator that may be employed with the plurality of spaced electromechanical resonators shown in FIG. 2A.

In another embodiment, one or more, or all, the plurality of electromechanical resonators 34, FIG. 2A, may include at least one MEMS frequency tunable electromagnetic resonator, such as electromechanical tuning fork resonator 100, FIG. 6. Tuning fork resonator 100 includes tuning fork 102 with electrodes 104, 105, and 107 disposed on the sides of tuning fork 102. Tuning fork resonator 100 typically is disposed on a solid material, e.g., a wafer of silicon that functions as electromagnetic medium 32, FIG. 2A, and is attached to the solid material by anchors, e.g., anchors 109 and 111. In other designs, tuning fork 100 may be disposed inside the solid material (not shown).

In operation, the electric fields of electromagnetic wave 36, FIG. 2B, cause tines 113 and 115 of tuning fork 102, FIG. 6, to vibrate up and down in the opposite directions, e.g., into and out of the page as shown in the top view of FIG. 6. This converts and stores the electrical energy of electromagnetic wave 31 as mechanical vibrations to control the electromagnetic wave propagation properties of metamaterial 30. In one design, the operating frequency of tuning fork 100 is adjustable to change the electromagnetic wave propagation properties in metamaterial 30 by applying at least one of electrostatic voltages, magnetic forces, thermal actuation, chemical actuation and light-induction, as known by those skilled in the art. See, e.g., "*Reduction in Thermoelastic Dissipation in Micromechanical Resonators by Disruption of Heat Transport*," Candler, R. W. et al., Proceedings of Solid State Sensors and Actuators, pp. 45 to 48 (2004), incorporated by reference herein.

Figure 7:
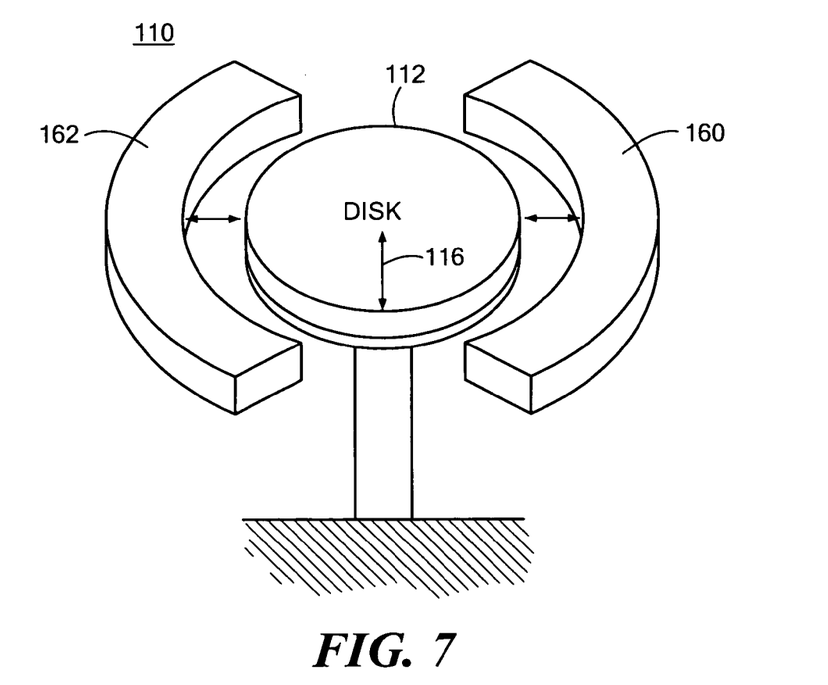
FIG. 7 is a three-dimensional view of an example of frequency tunable disk resonator electromechanical resonator that may be employed with the plurality of spaced electromechanical resonators shown in FIG. 2A.

In another example, one or more, or all, of the plurality of electromechanical resonators 34, FIG. 2A, may include at least one MEMS frequency tunable electromagnetic resonator, such as disk resonator 110, FIG. 7. Disk resonator 110 includes disk 112 disposed about electrodes 160 and 162. Disk resonator 110 is disposed on a solid material, e.g., a wafer of silicon that functions as electromagnetic medium 32, FIG. 2A, and is attached to the solid material by anchors. In other designs, disk resonator 110 may be disposed inside the solid material (not shown).

In operation, the electric fields of electromagnetic wave 36 cause disk 112, FIG. 7, to expand and contract about its radius as shown by arrow 116 to effectively convert and store the electric energy of the electromagnetic wave to mechanical vibrations to control the electromagnetic wave propagation properties of the wave in metamaterial 30.

In one design, the operating frequency of disk resonator 110 is adjustable to change the electromagnetic wave propagation properties in metamaterial 30 by applying at least one of electrostatic voltages, magnetic forces, thermal actuation, chemical actuation and light-induction, as known by those skilled in the art. See, e.g., "*High-Q UHF Micromechanical Radial-Contour Mode Disk Resonators*", Clark, J. R., et al., Microelectromechanical Systems, Journal of, Volume 14, Issue 6, pp. 1298 to 1310 (December 2005), incorporated by reference herein.

Figure 8:
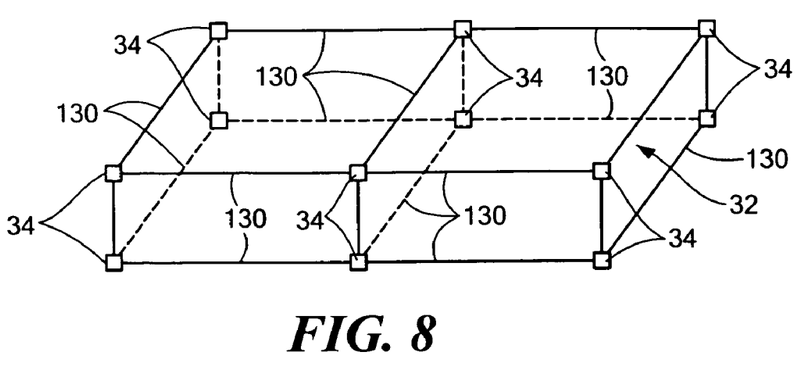
FIG. 8 is a schematic three dimensional view showing an example of a lattice arrangement of the plurality of electromechanical resonators shown in FIG. 2A.

The plurality of resonators 34, FIG. 2, may be configured as a lattice network, such as lattice network 130, FIG. 8. In one design, the plurality of electromagnetic resonators 34 are disposed in electromagnetic medium 32, e.g., the ambient air, and are connected to each other by a variety of coupling mechanisms, including, but not limited to, electrical leads, transmission lines, mechanical coupling, or electromagnetic coupling through the surrounding medium 32. In other designs, the plurality of electromechanical resonators 34 may be arranged in a lattice network disposed on the electromagnetic medium 32, e.g., any solid, liquid, or gas.

Figure 9:
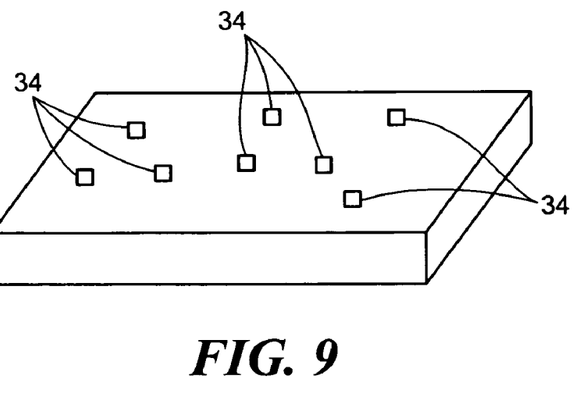
FIG. 9 is a schematic three dimensional view showing an example of the plurality of spaced electromechanical resonators shown in FIG. 2A arranged in two dimensions on the electromagnetic medium.
Figure 10:
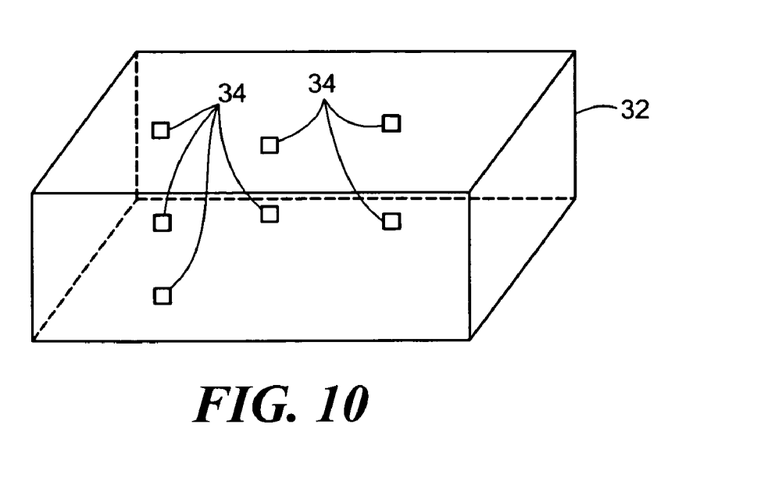
FIG. 10 is a schematic three dimensional view showing an example of the plurality of spaced electromechanical resonators shown in FIG. 2A arranged in and on three-dimensions on the electromagnetic medium.

The plurality of electromechanical resonators 34, FIG. 2, may be disposed in a two dimensional arrangement on electromagnetic medium 32, as shown in FIG. 9, or in a three dimensional arrangement and/or on electromagnetic medium 32, as shown in FIG. 10. In one embodiment, the plurality of electromechanical resonators 34, FIG. 2, may be disposed in a one dimensional arrangement, e.g., for an antenna, phase shifter, or circuit elements.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. An electromagnetic composite metamaterial comprising:
   an electromagnetic medium; and
   a plurality of spaced electromechanical resonators disposed in or on the electromagnetic medium configured to control electromagnetic wave propagation properties in the electromagnetic composite metamaterial.

2. The electromagnetic metamaterial of claim 1 in which the plurality of spaced electromechanical resonators in or on the electromagnetic medium control electromagnetic wave propagation properties chosen from the group consisting of: velocity, index of refraction, wavelength, direction, dispersion, phase shift, and impedance.

3. The electromagnetic metamaterial of claim 1 in which the electromagnetic medium includes a medium chosen from the group consisting of: a solid material, a liquid, and a gas.

4. The electromagnetic metamaterial of claim 1 in which one or more of the plurality of spaced electromechanical resonator includes at least one MEMS piezoelectric resonator.

5. The electromagnetic metamaterial of claim 1 in which one or more of the plurality of spaced electromechanical resonators includes at least one MEMS frequency tunable electromechanical resonator.

6. The electromagnetic metamaterial of claim 5 in which the operating frequency of the at least one MEMS frequency tunable electromagnetic resonators is adjustable to change the electromagnetic wave propagation properties in metamaterial by applying at least one of electrostatic voltages, magnetic forces, thermal actuation, chemical actuation, and light induction.

7. The electromagnetic metamaterial of claim 5 in which the at least one MEMS frequency tunable electromagnetic resonator includes at least one cantilever electromechanical resonator.

8. The electromagnetic metamaterial of claim 5 in which the at least one MEMS frequency tunable electromechanical resonator includes at least one paddle electromechanical resonator.

9. The electromagnetic metamaterial of claim 5 in which the at least one MEMS frequency tunable electromechanical resonators include at least one tuning fork electromechanical resonator.

10. The electromagnetic metamaterial of claim 5 in which the at least one MEMS frequency tunable electromechanical resonator includes at least one disk electromechanical resonator.

11. The electromagnetic metamaterial of claim 4 in which the at least one MEMS piezoelectric resonator includes a piezoelectric resonator chosen from the group consisting of: a surface acoustic wave piezoelectric resonator, a contour mode piezoelectric resonator, a thickness mode piezoelectric resonator, a shear mode piezoelectric resonator, and a Lamé mode piezoelectric resonator.

12. The electromagnetic metamaterial of claim 1 in which the plurality of spaced electromechanical resonators are disposed in or on the electromagnetic medium in a lattice network arrangement.

13. The electromagnetic metamaterial of claim 1 in which the plurality of spaced electromechanical resonators are configured in one dimension in or on the electromagnetic medium.

14. The electromagnetic metamaterial of claim 1 in which the plurality of spaced electromechanical resonators are configured in two dimensions in or on the electromagnetic medium.

15. The electromagnetic metamaterial of claim 1 in which the plurality of spaced electromechanical resonators are configured in three dimensions in or on the electromagnetic medium.

16. The electromagnetic metamaterial of claim 1 in which the plurality of spaced electromechanical resonators are disposed in the electromagnetic medium.

17. The electromagnetic metamaterial of claim 1 in which the plurality of spaced electromechanical resonators are disposed on the electromagnetic medium.

18. The electromagnetic metamaterial of claim 1 in which the plurality of spaced electromagnetic resonators are disposed at an interface between one or more electromagnetic media.

19. The electromagnetic metamaterial of claim 1 in which the electromagnetic composite metamaterial is configured as an antenna.

20. The electromagnetic metamaterial of claim 1 in which the electromagnetic composite metamaterial is configured as a phase shifter.

21. The electromagnetic metamaterial of claim 1 in which electromagnetic composite metamaterial is configured as a delay element.

22. The electromagnetic metamaterial of claim 1 in which the electromagnetic composite metamaterial is configured as a beam focusing device.

23. The electromagnetic metamaterial of claim 1 in which the electromagnetic composite metamaterial is configured as a beam steering device.

24. The electromagnetic metamaterial of claim 1 in which the electromagnetic composite metamaterial is configured as a frequency selective surface.

25. The electromagnetic metamaterial of claim 1 in which the electromagnetic composite metamaterial is configured as a lens.

26. An electromagnetic composite metamaterial comprising:
   an electromagnetic medium; and
   a plurality of spaced MEMS resonators disposed in or on the electromagnetic medium configured to control electromagnetic wave propagation properties in the electromagnetic composite metamaterial.

27. An electromagnetic composite metamaterial comprising:
   an electromagnetic medium; and
   a plurality of spaced electromechanical resonators having an electromagnetic wave traveling therein disposed in or on the electromagnetic medium configured to control propagation properties of the electromagnetic wave in the electromagnetic composite metamaterial.

28. An electromagnetic composite metamaterial comprising:
   an electromagnetic medium; and
   a plurality of spaced MEMS piezoelectric electromechanical resonators having an electromagnetic wave traveling therein disposed in or on the electromagnetic medium configured to control propagation properties of the electromagnetic wave in the electromagnetic composite metamaterial.

29. An electromagnetic composite metamaterial comprising:
   an electromagnetic medium; and
   a plurality of spaced MEMS frequency tunable electromechanical resonators having an electromagnetic wave traveling therein disposed in or on the electromagnetic medium configured to control propagation properties of the electromagnetic wave in the electromagnetic composite metamaterial.

30. An electromagnetic composite metamaterial comprising:
   an electromagnetic medium; and
   a plurality of spaced MEMS cantilever electromechanical resonators having an electromagnetic wave traveling therein disposed in or on the electromagnetic medium configured to control propagation properties of the electromagnetic wave in the electromagnetic composite metamaterial.

31. An electromagnetic composite metamaterial comprising:
   an electromagnetic medium; and
   a plurality of spaced MEMS paddle electromechanical resonators having an electromagnetic wave traveling therein disposed in or on the electromagnetic medium configured to control propagation properties of the electromagnetic wave in the electromagnetic composite metamaterial.

32. An electromagnetic composite metamaterial comprising:
   an electromagnetic medium; and
   a plurality of spaced MEMS tuning fork electromechanical resonators having an electromagnetic wave traveling therein disposed in or on the electromagnetic medium configured to control propagation properties of the electromagnetic wave in the electromagnetic composite metamaterial.

33. An electromagnetic composite metamaterial comprising:
   an electromagnetic medium; and
   a plurality of spaced MEMS disk electromechanical resonators having an electromagnetic wave traveling therein disposed in or on the electromagnetic medium configured to control propagation properties of the electromagnetic wave in the electromagnetic composite metamaterial.

* * * * *